United States Patent
Toyoyasu et al.

(10) Patent No.: US 6,624,571 B1
(45) Date of Patent: Sep. 23, 2003

(54) ELECTROLUMINESCENT DISPLAY

(75) Inventors: Tadokoro Toyoyasu, Niigata (JP); Ohkawa Hiroshi, Niigata (JP); Wakai Hitoshi, Niigata (JP)

(73) Assignee: Nippon Seiki Co., Ltd., Niigata (JP)

(*) Notice: Subject to any disclaimer, the term of this patent is extended or adjusted under 35 U.S.C. 154(b) by 0 days.

(21) Appl. No.: 09/486,631

(22) PCT Filed: May 24, 1999

(86) PCT No.: PCT/JP99/02726
§ 371 (c)(1),
(2), (4) Date: Feb. 29, 2000

(87) PCT Pub. No.: WO00/01204
PCT Pub. Date: Jan. 6, 2000

(30) Foreign Application Priority Data

Jun. 30, 1998 (JP) .......................... 10-183134
Jun. 30, 1998 (JP) .......................... 10-183137

(51) Int. Cl.$^7$ ................................ B05D 5/12
(52) U.S. Cl. .................. 313/510; 362/509; 362/513
(58) Field of Search .................. 313/505, 504, 313/506, 503, 509, 513

(56) References Cited

U.S. PATENT DOCUMENTS

| | | | |
|---|---|---|---|
| 5,400,047 A | | 3/1995 | Beesely |
| 6,010,742 A | * | 1/2000 | Tanabe et al. .......... 427/66 |
| 6,091,078 A | * | 7/2000 | Codama .......... 257/40 |
| 6,140,765 A | * | 10/2000 | Kim et al. .......... 313/506 |
| 6,326,726 B1 | * | 12/2001 | Mizutani et al. .......... 313/504 |
| 6,351,068 B2 | * | 2/2002 | Yamazaki et al. .......... 313/506 |
| 6,433,355 B1 | * | 8/2002 | Riess et al. .......... 257/40 |

FOREIGN PATENT DOCUMENTS

| | | |
|---|---|---|
| EP | 0 891 122 A1 | 1/1999 |
| JP | 57-9977 | 1/1982 |
| JP | 63298990 | 12/1988 |
| JP | 1-137595 | 5/1989 |
| JP | 3-8375 | 1/1991 |
| JP | 3-274695 | 12/1991 |
| JP | 6-52990 | 2/1994 |
| JP | 8-31573 | 2/1996 |
| JP | 8-222374 | 8/1996 |
| JP | 9-106887 | 4/1997 |
| JP | 10-3987 | 1/1998 |
| JP | 10012386 | 1/1998 |
| JP | 10199680 | 7/1998 |

* cited by examiner

Primary Examiner—Sandra O'Shea
Assistant Examiner—Anabel Ton
(74) Attorney, Agent, or Firm—McDermott, Will & Emery

(57) ABSTRACT

There is disclosed an electroluminescent (EL) device accomplishing improved visual performance. The device has a transparent substrate on which a transparent electrode layer is formed. The transparent electrode layer is partitioned into segments to represent desired shapes in terms of pixels by selective emission of the segments. Parts of the transparent electrode layer are brought out toward the outer periphery of the transparent substrate to form terminals. Display electrodes, the terminals, and conductive interconnects that are different in function are formed from the transparent electrode layer. The conductive interconnects connect the display electrodes with the terminals. Other terminals for connection with a back electrode are also formed from the transparent electrode layer. An auxiliary electrode layer having a resistivity smaller than that of the transparent electrode layer is formed on the transparent electrode layer. An intermediate dielectric layer is formed over the transparent electrode layer except for locations where the display electrodes and the first-mentioned terminals are present. An emissive layer is formed on the display electrodes and on the dielectric layer. The back electrode is formed over the emissive layer and located opposite to the display electrodes.

2 Claims, 5 Drawing Sheets

ELECTROLUMINESCENT DISPLAY

BACKGROUND OF THE INVENTION

1. Field of the Invention

The present invention relates to an electroluminescent (EL) device comprising a transparent electrode layer made of a transparent conductive material having display electrodes in the form of segments that are selectively activated to represent desired characters, a back electrode located opposite to the transparent electrode layer, and an emissive layer, or phosphor layer, sandwiched between the transparent electrode layer and the back electrode.

2. Description of the Related Art

A so-called thin-film electroluminescent (TFEL) display is disclosed in Japanese Patent No. 2758785. That is, this display is fabricated by stacking a transparent electrode layer, an intermediate layer, an emissive layer (phosphor layer), and a back electrode located opposite at least to the transparent electrode layer on a transparent substrate. The transparent electrode layer forms display electrodes and conductive interconnects that are different in function. The intermediate layer is made of a dielectric material. The dielectric layer is made of a dielectric layer. A so-called organic electroluminescent (EL) device is disclosed, for example, in Japanese Patent Publication No. 32307/1994. This organic EL device is fabricated by stacking an anode, at least one organic layer, and a cathode of a metal conductive material on a transparent substrate. The organic layer consists either of an organic emissive layer or of a multilayer structure of organic layers such as a hole injection layer and, if necessary, a hole transport layer is added.

In such an electroluminescent (EL) device, an AC voltage of hundreds of volts is applied between a transparent electrode layer and a back electrode to excite a fluorescent material that is in the emission centers of the emissive layer. On returning to the ground state, the excited fluorescent material emits light.

The aforementioned transparent electrode layer is made of a transparent conductive material such as indium-tin oxide (ITO) that transmits light emitted from the emissive layer. The transparent electrode layer is partitioned into segments to represent desired shapes in terms of pixels by selective emission of the segments. Conductive interconnects are positioned from terminals to display electrodes. These conductive interconnects have resistances of tens of $\Omega/\square$. Voltage drops occur across these conductive interconnects. If the conductive interconnects have different lengths, the voltage applied to each pixel becomes nonuniform, producing nonuniform emission. This impairs the display quality.

The back electrode described above is made of a conductive metal material such as aluminum that has a low resistivity and can be easily shaped into a film. Because of the film formation described above, the surface of the back electrode assumes a mirror-like state. Consequently, the surrounding scene may be seen by reflection off the back electrode. Again, this impairs the display quality.

In the aforementioned organic EL device, a DC voltage of several volts to tens of volts is applied between the anode and the cathode to cause the organic layer to emit light. The organic EL device has the advantage that it can be driven at a lower driving voltage than other kinds of EL devices.

The cathode of this organic EL device is made of a conductive metal material such as aluminum that has a low resistivity and can be easily shaped into a film. Because of the film formation described above, the surface of the cathode takes on a mirror-like state and the surrounding scene might be seen by reflection off the cathode. This deteriorates the display quality.

SUMMARY OF THE INVENTION

It is an object of the present invention to provide an EL device free of the foregoing problems.

This object is achieved by an electroluminescent (EL) device comprising a transparent substrate (1), a transparent electrode layer (2) formed on the substrate (1) and forming display electrodes (21) and conductive interconnects (23) that differ in function, at least one intermediate layer (4) made of a dielectric material formed on the transparent electrode layer (2), an emissive layer (5) formed on the intermediate layer (4), and a back electrode (6) formed on the emissive layer (5). The back electrode (6) is located opposite to the display electrodes (21). Auxiliary electrodes (3) made of a conductive metal material having a resistivity smaller than that of the material of the transparent electrode layer (2) are formed on the conductive interconnects (23).

Because the auxiliary electrodes (3) made of a conductive metal material having a resistivity smaller than that of the conductive interconnects (23) are formed on the conductive electrodes (23), voltage drops across the conductive interconnects (23) located between the terminals (22) and the display electrodes (21) are suppressed.

In one feature of the invention, the back electrode (6) and the auxiliary electrodes (3) are made of the same material (e.g., Cr or Al). This suppresses the aforementioned undesirable phenomenon, i.e., the auxiliary electrodes (3) are seen to float over the back electrode (6) when the EL device is viewed.

The above-described object is also achieved by an electroluminescent (EL) device fabricated by forming a transparent electrode layer (2) over the whole surface of a transparent substrate (1), forming an auxiliary electrode layer (3) over the whole surface of the transparent electrode layer (2), patterning the transparent electrode layer (2) and the auxiliary electrode layer (3) by etching to form display electrodes (21) and conductive interconnects (23) that differ in function, etching away the portions of auxiliary electrode layer (3) overlying the display electrodes (21), and then forming at least an emissive layer (5) and a back electrode (6) in turn on the remaining laminate.

This fabrication process provides an excellent etch selectivity and is straightforward. Voltage drops across the conductive interconnects (23) extending from the terminals (22) to the display electrodes (21) can be suppressed.

An electroluminescent (EL) device is also fabricated in accordance with the teachings of the invention by forming a transparent electrode layer (2) over the whole surface of a transparent substrate (1), forming a masking layer (31) of Cr over the whole surface of the transparent electrode layer (2), patterning the transparent electrode layer (2) and the masking layer (31) by etching to form display electrodes (21) protected by the masking layer (31), depositing aluminum (Al) on the display electrodes (21) to form conductive interconnects (23), removing the masking layer (31) on the display electrodes (21) differing in function from the display electrodes (21), and then forming at least an emissive layer (5) and a back electrode (6) of Al in turn. As a result, the undesired phenomenon, i.e., the auxiliary electrodes (3) are seen to float over the back electrode (6) when the EL device is viewed, is suppressed.

The present invention also provides an electroluminescent (EL) device comprising a transparent substrate (1), a transparent electrode layer (2) formed on the transparent substrate (1) and forming display electrodes (21) and conductive interconnects (23) that differ in function, a back electrode (6) formed opposite to the transparent electrode layer (2), an emissive layer (5) formed between the back electrode (6) and the transparent electrode layer (2), and terminals (22) formed by portions of the conductive interconnects (23) brought out toward the outer periphery of the transparent substrate (1). An auxiliary electrode layer (3) is formed on the transparent electrode layer (2) excluding the locations where the display electrodes (21) are formed so as to cover the whole surface of the transparent substrate (1) at least except for the locations where the display electrodes (21) are present.

When this EL device is viewed, the color of the auxiliary electrode layer (3) is imparted to all the portions excluding the display electrodes (21). Therefore, it is unlikely that the display electrodes (21), the conductive interconnects (23), and the other portions are seen to exhibit three different colors, respectively.

The present invention also provides an electroluminescent (EL) device comprising a transparent substrate (1), a transparent electrode layer (2) formed on the transparent substrate (1) and forming display electrodes (21) and conductive interconnects (23) that differ in function, a back electrode (6) formed opposite to the transparent electrode layer (2), an emissive layer (5) formed between the back electrode (6) and the transparent electrode layer (2), and terminals (22) formed by portions of the conductive interconnects (23) brought out toward the outer periphery of the transparent substrate (1). An auxiliary electrode layer (3) is formed on the transparent electrode layer (2) excluding locations where the display electrodes (21) are present. An intermediate layer (4) is interposed between the transparent electrode layer (2) or the auxiliary electrode layer (3) and the emissive layer (5). The intermediate layer (4) is made of a material having a color that has excellent ability to block light such as black. The intermediate layer (4) covers the whole surface of the transparent electrode layer (2) except for locations where the display electrodes (21) and the terminals (22) are present. When this EL device is viewed, the color of the auxiliary electrode layer (3) is imparted to all the portions excluding the display electrodes (21). Therefore, it is unlikely that the display electrodes (21), the conductive interconnects (23), and the other portions are seen to exhibit three different colors, respectively.

Furthermore, the present invention provides an electroluminescent (EL) device (100) comprising a transparent substrate (200), an anode (300) made of a transparent conductive material and formed on the substrate (200), at least one organic layer (400) formed on the anode (300), and a cathode (500) made of a conductive material and formed on the anode (300). The material of the cathode (500) has a low optical reflectance. A thin-film layer (600) is interposed between the cathode (500) and the organic layer (400) to promote electron injection from the cathode (500) into the organic layer (400). Consequently, the aforementioned undesired phenomenon, i.e., the surrounding scene is seen by reflection off the cathode (500) when the EL device (100) is viewed, can be suppressed; otherwise, the display quality would be impaired.

In one feature of the structure described above, the cathode (500) is made of carbon (C). In this case, it is relatively easy to form the film of the cathode (500). The process step for fabricating the cathode (500) is not complicated.

In another feature of the structure described above, the thin-film layer (600) is made of an electron transfer compound or an electron transfer material doped with a metal material having a low work function. As a consequence, the process step for forming the thin-film layer (600) is not complicated.

In addition, the present invention provides an electroluminescent (EL) device (100) comprising a transparent substrate (200), an anode (300) made of a transparent conductive material and formed on the substrate (200), at least one organic layer (400) formed on the anode (300), and a cathode (500) made of a conductive material and formed on the organic layer (400). The cathode (500) is made of a material having a low optical reflectance. An electron transport layer (610) made of an electron transport material and an electron injection layer (620) are stacked from the side of the organic layer (400) between the cathode (500) and the organic layer (400). The electron injection layer (620) is made of an electron transfer compound or an electron transport material doped with a metal material having a low work function. Consequently, the aforementioned undesired phenomenon, i.e., the surrounding scene is seen by reflection off the cathode (500) when the EL device (100) is viewed, can be suppressed; otherwise, the display quality would be impaired.

In one feature of the structure described above, the cathode (500) is made of carbon (C). In this case, it is relatively easy to form the film of the cathode (500). The process step for fabricating the cathode (500) is not complicated.

Other objects and features of the invention will appear in the course of the description thereof, which follows.

DESCRIPTION OF THE PREFERRED EMBODIMENTS

The preferred embodiments of the present invention are hereinafter described with reference to the accompanying drawings. FIGS. 1–6 pertain to electroluminescent (EL) devices.

Figure 1:
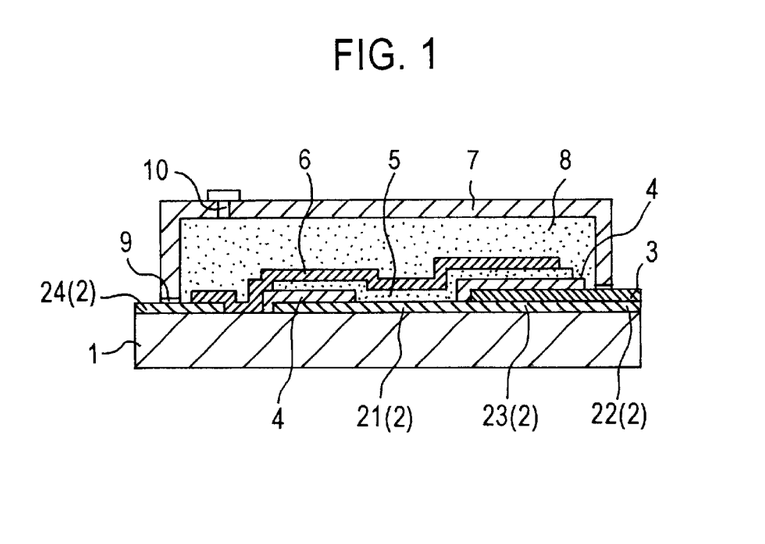
FIG. 1 is a cross-sectional view of main portions of an electroluminescent (EL) device in accordance with a first embodiment of the present invention.
Figure 2:
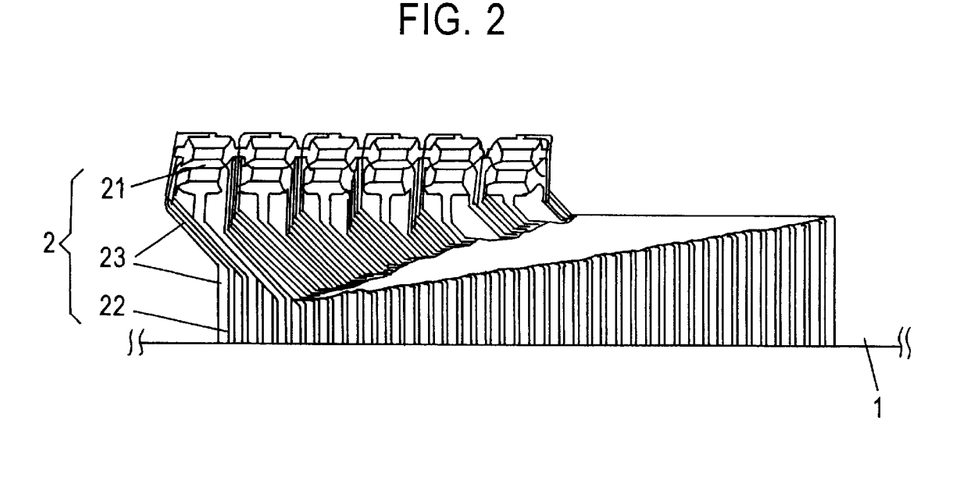
FIG. 2 is a plan view of the main portions of the EL device shown in FIG. 1.

Referring to FIGS. 1–3, there is shown an electroluminescent (EL) device in accordance with a first embodiment of the present invention. This device has a transparent substrate 1 made of a degreased soda glass or the like. A transparent electrode layer 2 is formed on the substrate 1 and made of a transparent conductive material such as ITO. The electrode layer 2 has display electrodes 21 forming segments to represent desired shapes by selective emission of the segments. Furthermore, the electrode layer 2 has terminals 22 brought out toward the outer periphery of the transparent substrate 1 and conductive interconnects 23 for connecting the display electrodes 21 with the terminals 22. Hence, the electrode layer 2 is separated into the display electrodes 21, terminals 22, and conductive interconnects 23 that differ in function. Furthermore, the transparent electrode layer 2 has terminals 24 for a back electrode (described later). An auxiliary electrode layer 3 made of a conductive metal material such as chromium having a resistivity smaller than that of the transparent electrode layer 2 is formed on the conductive interconnects 23. An intermediate dielectric layer 4 is made of a dielectric material such as alumina or silicon nitride and formed on the transparent electrode layer 2 excluding the portions where the display electrodes 21 and the terminals 22 are formed. An emissive layer 5 is formed on the display electrodes 21 and on the dielectric layer 4 and made of zinc sulfide containing an emissive material that is manganese acting as emission centers. The aforementioned back electrode, indicated by numeral 6, is formed on the emissive layer 5 and located opposite to the display electrodes 21. The back electrode 6 is made of a conductive metal material such as aluminum (Al). Parts of the back electrode 6 are also brought out to the surroundings of the transparent substrate 1 and connected with the terminals 24 similarly to the transparent electrode layer 2.

If parts of the back electrode 6 are brought out directly to the surroundings of the transparent substrate 1 and connected with a power supply, the terminals 24 can be omitted.

The laminate beginning with the transparent electrode layer 2 and ending with the back electrode 6 is formed by stacking layers successively by evaporation, sputtering, or other appropriate method.

A layer 7 is made of a sealant material similar to the material of the transparent substrate 1 and adhesively bonded to the substrate 1. The sealant layer 7 is centrally provided with a recess to receive a liquid 8 for protecting the insulation. This liquid 8 for protecting the insulation is injected into the recess by previously injecting the liquid into the recess in the layer of the sealant material 7 using a dispenser or other tool, then aligning the transparent substrate 1 on which the layers 2–6 have been stacked to the sealant layer 7 carrying adhesive 9, and bonding the substrate 1 to the layer 7. Alternatively, the sealant layer 7 carrying adhesive is aligned to the transparent substrate 1 having the layers 2–6 thereon, bonded to the substrate 1, and then the liquid 8 for protecting the insulation is injected into the recess from an injection port 10 formed in the sealant layer 7.

In this EL device, since the auxiliary electrode layer 3 made of a conductive material such as Cr having a resistivity smaller than that of the conductive interconnects 23 is formed on the conductive interconnects 23, voltage drops across the conductive interconnects 23 located between the terminals 22 and the display electrodes 21 are suppressed. Therefore, nonuniformity of emission that would otherwise be caused by variations in length among the conductive interconnects 23 is reduced. This improves the esthetical appearance of the device.

Figure 3A:
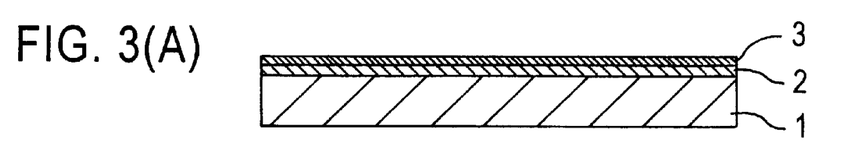
FIGS. 3(A)–3(D) are cross-sectional views illustrating a process sequence for fabricating the EL device shown in FIGS. 1 and 2.
Figure 3B:
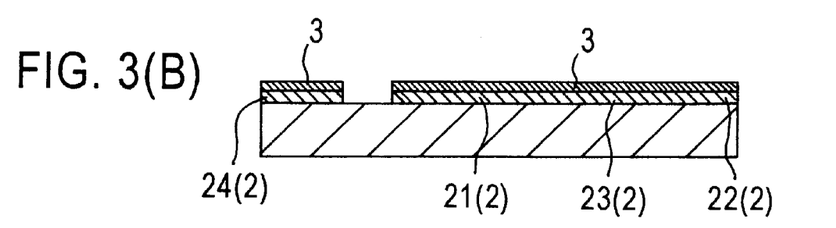
Figure 3C:
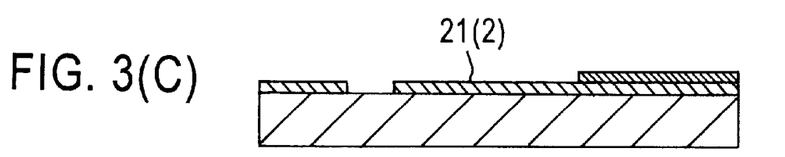
Figure 3D:
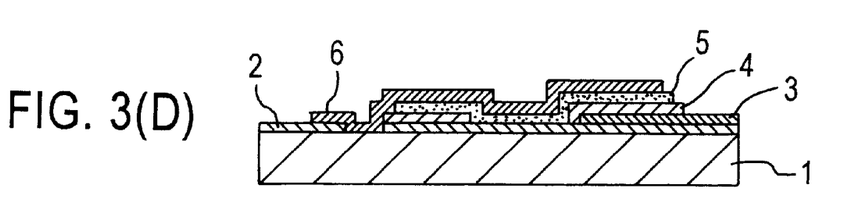

FIGS. 3(A)–3(D) illustrate a method of fabricating the EL device described above where the auxiliary electrode layer 3 is made of Cr. First, as shown in FIG. 3(A), the transparent electrode layer 2 of ITO is formed over the whole surface of the transparent substrate 1. Then, the auxiliary electrode layer 3 of Cr is formed over the whole surface of the transparent electrode layer 2. Then, as shown in FIG. 3(B), the transparent electrode layer 2 of ITO and the auxiliary electrode layer 3 of C are patterned by etching to form the display electrodes 21, the terminals 22, the conductive interconnects 23, and the terminals 24, using the auxiliary electrode layer 3 as a masking material. Subsequently, as shown in FIG. 3(C), portions of the auxiliary electrode layer 3 of Cr that cover the display electrodes 21 are removed. Finally, as shown in FIG. 3(D), the necessary layers are deposited in succession, and finally the back electrode 6 is formed from Al.

Because the auxiliary electrode layer 3 made of Cr is used as described above, the following process sequence is enabled. The transparent substrate 1, the transparent electrode layer 2, and the auxiliary electrode layer 3 are formed in succession. The transparent electrode layer 2 is patterned to form the display electrodes 21, the terminals 22, the conductive interconnects 23, and the terminals 24. Then, only the portions of the auxiliary electrode layer 3 that cover the display electrodes 21 can be removed. Hence, high etch selectivity is obtained. The process sequence can be simplified. Since the voltage drops across the conductive interconnects located between the terminals 22 and the display electrodes 21 can be suppressed, nonuniformity of emission which would otherwise be caused by variations in length among the conductive interconnects 23 is reduced. Hence, the display quality can be improved.

If the back electrode 6 and the auxiliary electrodes 3 are made of the same material such as Cr, the aforementioned drawback, i.e., the auxiliary electrodes 3 are seen to float over the back electrode 6 when the EL device is viewed, can be circumvented. This is favorable from an esthetical point of view.

Figure 4A:
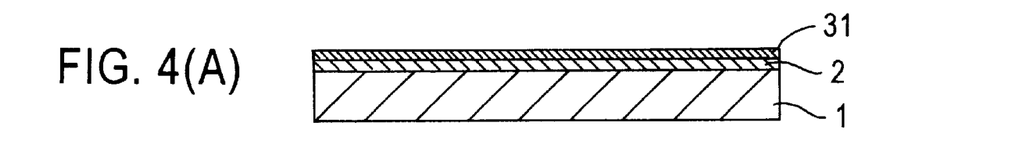
FIGS. 4(A)–4(G) are cross-sectional views illustrating a process sequence for fabricating an EL device in accordance with a second embodiment of the invention.
Figure 4B:
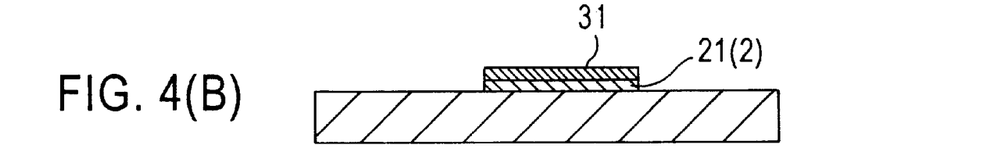
Figure 4C:
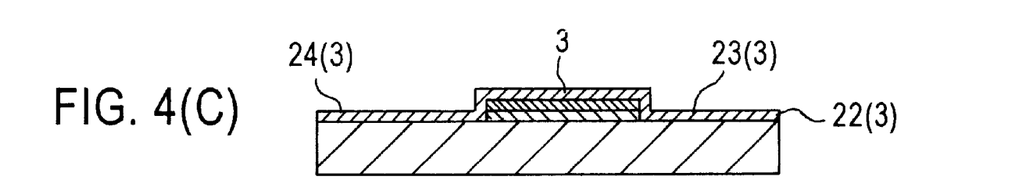
Figure 4D:
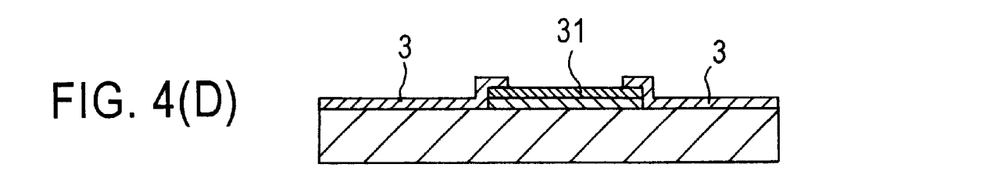
Figure 4E:
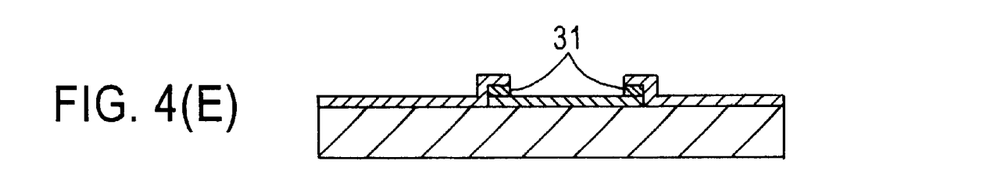
Figure 4F:
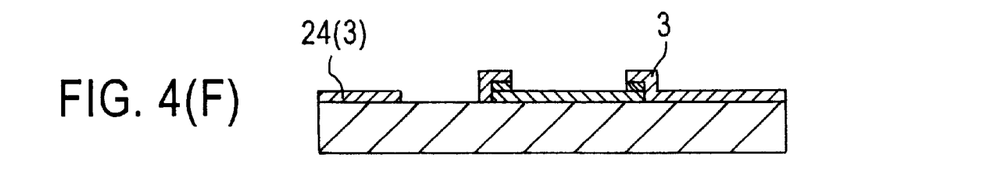
Figure 4G:
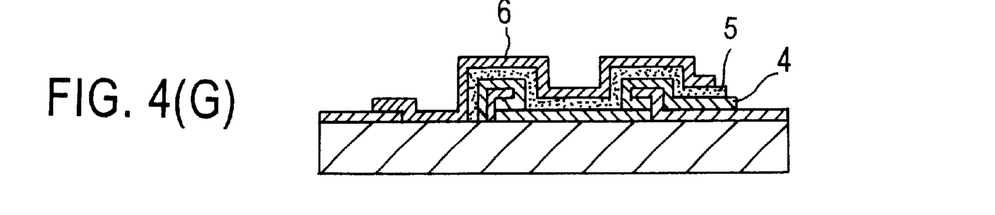

A method of fabricating an EL device built in accordance with a second embodiment of the present invention is illustrated in FIGS. 4(A)–(G). This EL device is similar to the EL device described previously except that the back electrode 6 and the auxiliary electrodes 3 are made of the same material such as Al. First, as shown in FIG. 4(A), a transparent electrode layer 2 of ITO is formed over the whole surface of a transparent substrate 1. A masking layer 31 of Cr is formed over the whole surface of the transparent electrode layer 2. Then, as shown in FIG. 4(B), the transparent electrode layer 2 and the masking layer 31 are patterned by etching to form display electrodes 21. Thereafter, as shown in FIG. 4(C), an auxiliary electrode layer 3 of Al that will become terminals 22, conductive interconnects 23, and terminals 24 is formed on the remaining laminate. Then, as shown in FIG. 4(D), the Al auxiliary electrode layer 3 is etched away except for the locations where the display electrodes 21 are present. The masking layer 31 that protects the display electrodes 21 is removed (FIG. 4(E)). The auxiliary electrode layer 3 is patterned into a desired shape (FIG. 4(F)). Necessary layers are successively formed on the laminate. Finally, a back electrode 6 is formed from Al (FIG. 4(G)). Consequently, the aforementioned drawback, i.e., the auxiliary electrodes 3 are seen to float over the back electrode 6 when the EL device is viewed, can be circumvented. This is favorable from an esthetical point of view.

Figure 5:
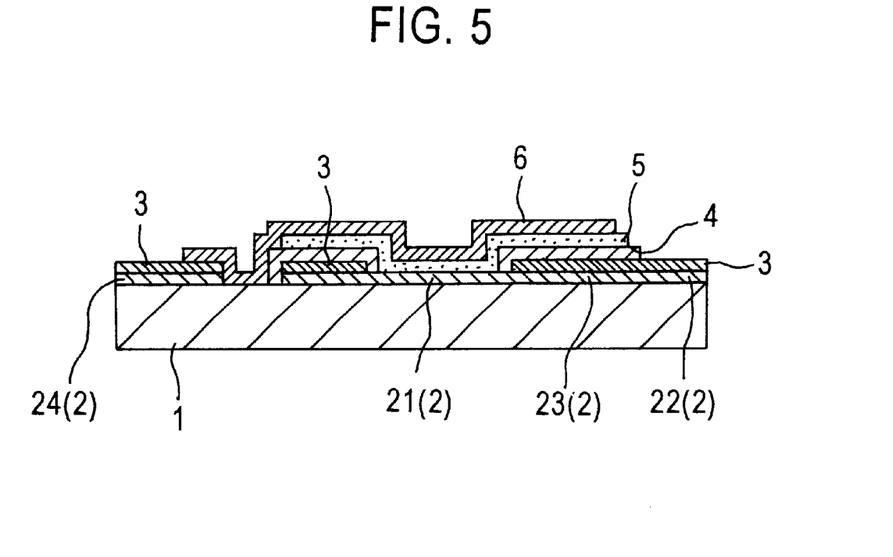
FIG. 5 is a cross-sectional view of main portions of an EL device in accordance with a third embodiment of the invention.

Referring next to FIG. 5, there is shown an EL device in accordance with a third embodiment of the invention. This EL device has a transparent substrate 1 on which a transparent electrode layer 2 is formed. The transparent electrode layer 2 is formed into display electrodes 21, conductive interconnects 23, and terminals 24 for connection with a back electrode 6. These display electrodes 21, conductive interconnects 23, and terminals 24 differ in function. The back electrode 6 is formed opposite to the transparent electrode layer 2. An emissive layer 5 is formed between the back electrode 6 and the transparent electrode layer 2. The conductive interconnects 23 are brought out to the surroundings to the transparent substrate 1 to form terminals 22. An auxiliary electrode layer 3 is formed over the transparent electrode layer 2 except for the locations where the display electrodes 21 are present. The auxiliary electrode layer 3 covers the whole surface of the transparent substrate 1 except for the locations where the display electrodes 21 exist and (if possible) except for the locations where the terminals 22 are formed. An intermediate dielectric layer 4 is interposed between the transparent electrode layer 2 or the auxiliary electrode layer 3 and the emissive layer 5.

In this structure, when the EL device is viewed, the color of the auxiliary electrodes 3 is imparted to all the portions excluding the locations where the display electrodes 21 are present. Therefore, it is unlikely that the display electrodes 21, the conductive interconnects 23, and the other portions are seen to exhibit three different colors, respectively. This improves the visual performance.

Figure 6:
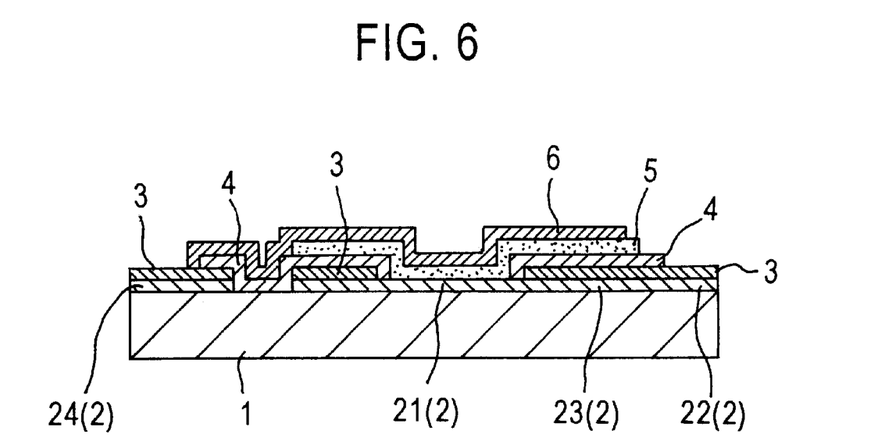
FIG. 6 is a plan view of main portions of an EL device in accordance with a fourth embodiment of the invention.

Referring next to FIG. 6, there is shown an EL device in accordance with a fourth embodiment of the present invention. This EL device has a transparent substrate 1 and a transparent electrode layer 2 formed on the substrate 1. The transparent electrode layer 2 is divided into display electrodes 21 and conductive interconnects 23 that differ in function. A back electrode 6 is formed opposite to the transparent electrode layer 2. An emissive layer 5 is interposed between the back electrode 6 and the transparent electrode layer 2. The conductive interconnects 23 are brought out toward the outer periphery of the transparent substrate 1 to form terminals 22. An auxiliary electrode layer 3 is formed over the transparent electrode layer 2 except for locations where the display electrodes 21 are present. An intermediate dielectric layer 4 is located between the transparent electrode layer 2 or the auxiliary electrode layer 3 and the emissive layer 5. The dielectric layer 4 is made of a dielectric material having a color that has excellent ability to block light such as black. The dielectric layer 4 covers the whole surface of the transparent substrate 1 excluding the locations where the display electrodes 21 and the terminals 22 are present.

In this structure, the color of the auxiliary electrodes 3 is imparted to all the portions excluding the locations where the display electrodes 21 are present when the EL device is viewed. Therefore, the aforementioned drawback, i.e., the display electrodes 21, the conductive interconnects 23, and the other portions are seen to exhibit three different colors, respectively, can be eliminated. This is favorable from an esthetical point of view.

It is to be noted that the present invention pertains to an electroluminescent (EL) device comprising a transparent electrode layer made of a transparent conductive material and forming.display electrodes shaped into segments to represent desired shapes by selective emission, a back electrode located opposite to the transparent electrode layer, and an emissive layer sandwiched between the transparent electrode layer and the back electrode. In so-called organic EL devices as disclosed in the above-cited Japanese Patent Publication No. 32307/1994 and Japanese Laid-Open No. 264692/1988, the present invention can be practiced in the same way as in the first and through fourth embodiments of the invention already described in connection with FIGS. 1–6. That is, an anode corresponding to the transparent electrode layer in the embodiments described above is formed on the transparent substrate. The anode is shaped into display electrodes and conductive interconnects that differ in function. A hole injection layer corresponding to the intermediate layer in the embodiments described above is formed on the anode. An emissive layer is formed on the hole injection layer. A cathode corresponding to the back electrode in the embodiments described above is formed on the emissive layer. A DC voltage of tens of volts is applied between the anode and the cathode to inject positive holes and electrons into the emissive layer. When they recombine, energy is produced, causing the emissive layer to emit light. That is, the "electroluminescent (EL) devices" referred to in the description of the various embodiments embrace organic EL devices, as well as thin film EL devices.

Figure 7:
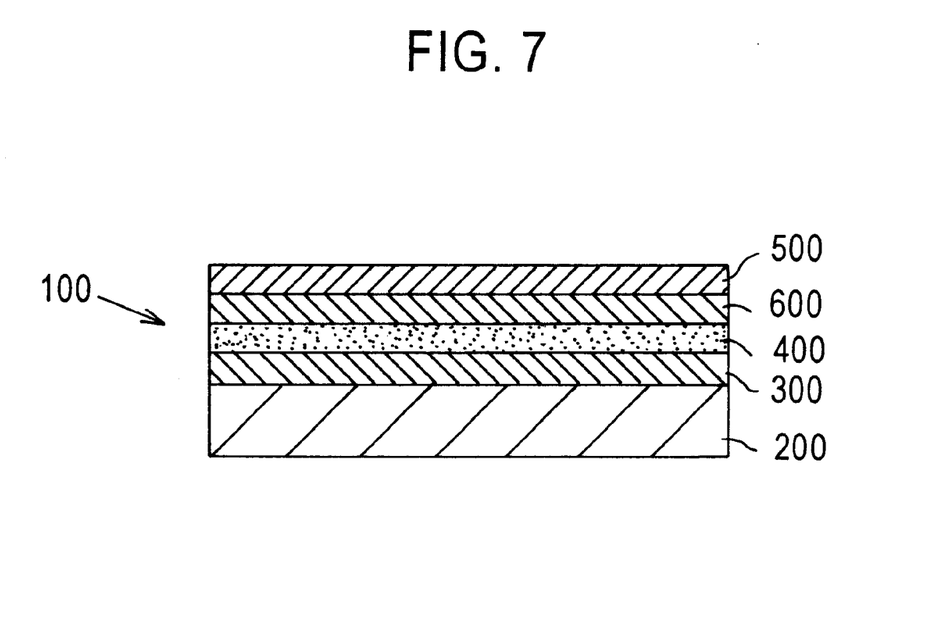
FIG. 7 is a cross-sectional view of main portions of an EL device in accordance with a fifth embodiment of the invention.
Figure 8:
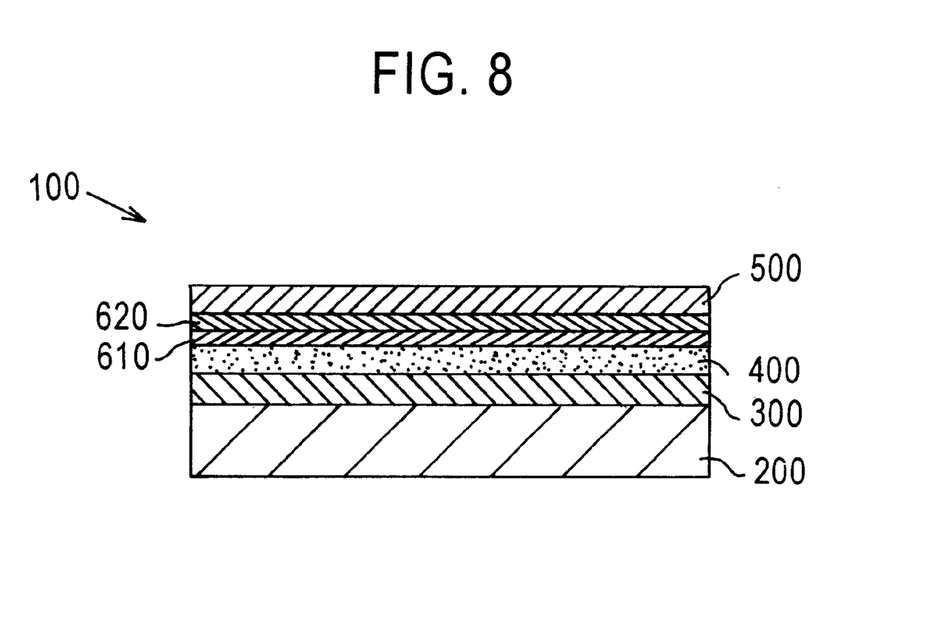
FIG. 8 is a cross-sectional view of main portions of an EL device in accordance with a sixth embodiment of the invention.

FIGS. 7 and 8 show organic EL devices in accordance with the present invention. FIG. 7 illustrates an organic EL device in accordance with a fifth embodiment of the invention. This organic EL device is generally indicated by reference numeral 100 and has a transparent substrate 200 on which an anode 300 made of a transparent conductive material and at least one organic layer 400 are laminated. The organic layer 400 consists of an organic emissive layer or of a multilayer structure made up of organic layers including a hole injection layer and, if necessary, a hole transport layer is added.

In this embodiment, a cathode 500 made of a conductive material having a low optical reflectance is formed on the organic layer 400. Preferably, the material of the cathode 500 has less of a tendency to reflect the surrounding scene to maintain well the display quality of the EL device 100. For example, carbon (C) can be used as a material providing high contrast. In this case, the thickness of the film is about 150 nm, and the film is formed by evaporation, solution coating, or other appropriate method. Carbon that is the material of the cathode 500 is easily available, and it is relatively easy to form carbon into a film. Furthermore, carbon does not complicate the process step for forming the cathode 500.

A thin-film layer 600 is formed between the organic layer 400 and the cathode 500 to promote electron injection from the cathode 500 into the organic layer 400. This thin-film layer 600 contributes to enhancement of the emission efficiency by accelerating electron injection from the cathode 500. One example of the thin-film layer 600 is an electron transfer compound (e.g., a compound of aluminum (Al) and lithium (Li)). Another example is an electron transport material such as Alq3:tris(8-quinolinolate) aluminum (III) doped with a metal material having a low work function such as Li. In this case, the film thickness is about 10 nm. The film can be formed by evaporation, solution coating, or other appropriate method. By making the thin-film layer 600 transparent or semi-transparent, the effect of high contrast owing to the background, dark cathode 500 is enhanced. Since the thin-film layer 600 is made of an electron transfer compound or an electron transport material doped with a metal material having a low work function, the layer 600 can be fabricated by the same method as used to form the organic layer 400 and the cathode 500. The process step for forming the thin-film layer 600 is not complex.

Because of this structure, the aforementioned undesired phenomenon, i.e., the surrounding scene is seen by reflection off the cathode 500 when the EL device 100 is viewed, can be suppressed. Hence, the display quality can be maintained high.

Referring next to FIG. 8, there is shown an EL device in accordance with a sixth embodiment of the invention. This EL device, generally indicated by reference numeral 100, has a transparent substrate 200 on which plural layers including an anode 300 and at least one organic layer 400 are formed. The anode 300 is made of a transparent conductive material. The organic layer 400 consists of an organic emissive layer or of a multilayer structure comprising organic layers including a hole injection layer and, if necessary, a hole transport layer is added. A cathode 500 made of a conductive material having a low optical reflectance is formed on the organic layer 400. Preferably, the material of the cathode 500 has less of a tendency to reflect the surrounding scene to maintain well the display quality of the EL device 100. In the same manner as in the fifth embodiment, C is deposited to a film thickness of about 150 nm by evaporation, solution coating, or other appropriate method to provide high contrast.

In this embodiment, a semi-transparent electron transport layer 610 and a semi-transparent electron injection layer 620 are laminated from the side of the organic layer 400 between the cathode 500 and the organic layer 400. The electron transport layer 610 is made of an electron transport material such as Alq3. The electron injection layer 620 is made of an electron transport material such as Alq3 doped with a metal material having a low work function such as Li. These electron transport layer 610 and electron injection layer 620 correspond to the thin-film layer 600 in the fifth embodiment. The layers 610 and 620 are formed to film thicknesses of about 10 nm by evaporation, solution coating, or other appropriate method. Because of this structure, the aforementioned undesired phenomenon, i.e., the surrounding scene is seen by reflection off the cathode 500 when the EL device 100 is viewed, can be suppressed. Hence, the display quality can be maintained high.

As can be understood from the description made thus far, the present invention provides an electroluminescent device having improved display quality.

What is claimed is:

1. An electroluminescent device comprising:

a transparent substrate;

a transparent electrode layer formed on said transparent substrate and forming display electrodes and conductive interconnects which differ in function;

a back electrode mounted opposite to said transparent electrode layer;

an emissive layer formed between said back electrode and said transparent electrode layer;

said conductive interconnects having portions brought out toward outer periphery of said transparent substrate to form terminals; and an auxiliary electrode layer formed to cover said transparent substrate except for locations where said display electrodes are present, said auxiliary electrode layer being formed on said transparent electrode layer.

2. An electroluminescent device comprising:

a transparent substrate;

a transparent electrode layer formed on said transparent substrate and forming display electrodes and conductive interconnects which differ in function;

a back electrode formed opposite to said transparent electrode layer;

an emissive layer formed between said back electrode and said transparent electrode layer;

said conductive interconnects having portions brought out toward outer periphery of said transparent substrate to form terminals;

an auxiliary electrode layer formed on said transparent electrode layer except for locations where said display electrodes are present; and an intermediate layer located between said transparent electrode layer or said auxiliary electrode layer and said emissive layer, said intermediate layer being made of a material having a color that has excellent ability to block light, said intermediate layer covering said transparent substrate except for locations where said display electrodes and said terminals are present.

* * * * *